(12) United States Patent
Sundaresan et al.

(10) Patent No.: US 11,302,776 B1
(45) Date of Patent: Apr. 12, 2022

(54) METHOD AND MANUFACTURE OF ROBUST, HIGH-PERFORMANCE DEVICES

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSiC Semiconductor Inc., Dulles (VG)

( * ) Notice: Subject to any disclaimer, the term of this patent is extended or adjusted under 35 U.S.C. 154(b) by 0 days.

(21) Appl. No.: 17/334,935

(22) Filed: May 31, 2021

(51) Int. Cl.
| | |
|---|---|
| *H01L 21/04* | (2006.01) |
| *H01L 29/06* | (2006.01) |
| *H01L 29/16* | (2006.01) |
| *H01L 29/66* | (2006.01) |
| *H01L 29/78* | (2006.01) |
| *H01L 29/10* | (2006.01) |

(52) U.S. Cl.
CPC ........ *H01L 29/063* (2013.01); *H01L 21/0465* (2013.01); *H01L 29/1095* (2013.01); *H01L 29/1608* (2013.01); *H01L 29/66068* (2013.01); *H01L 29/7802* (2013.01)

(58) Field of Classification Search
CPC ... H01L 21/04; H01L 21/046; H01L 21/0465; H01L 29/06; H01L 29/063; H01L 29/04; H01L 29/0465; H01L 29/10; H01L 29/1095; H01L 29/16; H01L 29/1608; H01L 29/66; H01L 29/66068; H01L 29/78; H01L 29/7802
USPC ....................................................... 438/268
See application file for complete search history.

(56) References Cited

U.S. PATENT DOCUMENTS

| | | |
|---|---|---|
| 6,200,884 B1 | 3/2001 | Yang et al. |
| 6,215,152 B1 | 4/2001 | Hebert |
| 7,037,792 B2 | 5/2006 | Lee et al. |
| 7,052,963 B2 | 5/2006 | Williams et al. |
| 7,282,412 B2 | 10/2007 | Williams et al. |
| 7,705,362 B2 | 4/2010 | Das et al. |
| 8,299,560 B2 | 10/2012 | Loechelt et al. |
| 8,513,103 B2 | 8/2013 | Park et al. |
| 8,530,299 B2 | 9/2013 | Loechelt et al. |
| 8,652,928 B2 | 2/2014 | Yoon et al. |
| 9,887,287 B1 * | 2/2018 | Lichtenwalner .... H01L 29/0692 |
| 10,217,636 B2 | 2/2019 | Aichinger et al. |
| 2019/0172910 A1 | 6/2019 | Siemieniec et al. |
| 2020/0381253 A1 * | 12/2020 | Schulze .............. H01L 29/1095 |
| 2021/0013310 A1 * | 1/2021 | Leendertz .......... H01L 29/0615 |

FOREIGN PATENT DOCUMENTS

WO   2019/139610 A1   7/2019

* cited by examiner

*Primary Examiner* — Fazli Erdem
(74) *Attorney, Agent, or Firm* — Dave Law Group LLC; Raj S. Dave

(57) ABSTRACT

An embodiment relates to a method and manufacture of robust, high-performance devices. The method comprises preparing a unit cell of a Silicon Carbide (SiC) substrate comprising a first conductivity type substrate and a first conductivity type drift layer; forming a second conductivity type well region; forming a first conductivity type source region within the second conductivity type well region; and forming a second conductivity type shield region surrounding the first conductivity type source region. The second conductivity type shield region formed comprises a portion of the second conductivity type shield region located on a SiC surface.

18 Claims, 10 Drawing Sheets

METHOD AND MANUFACTURE OF ROBUST, HIGH-PERFORMANCE DEVICES

RELATED APPLICATION

The present application is related to previously filed patent United States applications whose official filing details are as follows: U.S. patent application Ser. No. 16/352,698, filed Mar. 13, 2019, issued Feb. 9, 2021 (U.S. Pat. No. 10,916,632) entitled "DESIGN AND MANUFACTURE OF IMPROVED POWER DEVICES"; U.S. patent application Ser. No. 16/431,655, filed Jun. 4, 2019, entitled "DESIGN AND MANUFACTURE OF SELF-ALIGNED POWER DEVICES"; U.S. patent application Ser. No. 16/374,025, filed Apr. 3, 2019, issued Sep. 1, 2020 (U.S. Pat. No. 10,763,356), entitled "DESIGN AND MANUFACTURE OF POWER DEVICES HAVING INVERSION CHANNEL"; U.S. patent application Ser. No. 16/550,249 filed Aug. 25, 2019, entitled "DESIGN AND MANUFACTURE OF ROBUST, HIGH-PERFORMANCE DEVICES"; U.S. patent application Ser. No. 17/231,301, filed Apr. 15, 2021; entitled "DESIGN AND MANUFACTURE OF ROBUST, HIGH-PERFORMANCE DEVICES"; U.S. patent application Ser. No. 17/242,650, filed Apr. 28, 2021; entitled "DESIGN AND MANUFACTURE OF ROBUST, HIGH-PERFORMANCE DEVICES"; respectively, which are incorporated herein by reference in their entirety.

FIELD OF THE INVENTION

The present disclosure relates to power semiconductor devices using a vertical silicon carbide (SiC) metal oxide semiconductor field-effect transistor (MOSFET). A power metal oxide semiconductor field-effect transistor (MOSFET) is a specific type of MOSFET designed to handle significant power levels. The present disclosure more particularly relates to self-aligned power semiconductor devices.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV) and hence, SiC has a higher blocking voltage than Si. SiC has a higher breakdown electric field ($3 \times 10^6$ V/cm to $5 \times 10^6$ V/cm) compared to Si (breakdown electric field for Si is $0.3 \times 10^6$ V/cm) and is a better thermal conductor (3.7 (W/cm-K) for SiC versus 1.6 (W/cm-K) for Si). SiC has been a material of choice for power MOSFETs.

However, "[t]hreshold voltage of the power MOSFET is an important design parameter from an application standpoint. A minimum threshold voltage must be maintained at above 1 volt for most system applications to provide immunity against turn-on due to voltage spikes arising from noise. At the same time, a high threshold voltage is not desirable because the voltage available for creating the charge in the channel inversion layer is determined by ($V_G-V_T$) where $V_G$ is the applied gate bias and $V_T$ is the threshold voltage." [source: B. J. Baliga, Silicon Carbide Power Devices, Springer Press (2005), Page 234]

The [source: B. J. Baliga, Silicon Carbide Power Devices, Springer Press (2005), Page 235] threshold voltage of 4H—SiC planar MOSFETSs for the case of a gate oxide thickness is 0.1 microns. The results obtained for a silicon power MOSFET with the same gate oxide thickness is also provided in the figure for comparison.

In the race to achieve lower $R_{DS, ON}$ of planar gate SiC MOSFETs with high breakdown voltage ratings, it is a common practice to make the channel lengths ($L_{CH}$) as short as possible which reduces a great part of the conduction loss that is associated to the channel. The trade-off in doing so is that, as the channel lengths are becoming shorter, the MOSFET devices become susceptible to undesirable phenomena such as the DIBL effect (the Drain Induced Barrier Lowering effect) which is responsible for the poor device performance including but not limited to the roll-off of the threshold voltage ($V_{TH}$) at high drain bias and the increase of the drain leakage ($I_L$) at high drain bias. A conventional approach to mitigate this problem is to uniformly increase the doping concentration in the channel region, but this approach suffers from a higher than optimal gate threshold voltage and on-resistance, which can offset the gains achieved from the channel length reduction. Therefore, there is a long-felt need for a method and manufacture of robust, high-performance devices minimizing drain induced brain lowering effect.

SUMMARY OF INVENTION

The present disclosure discloses a method and manufacture of robust, high-performance devices.

In an aspect a method is described. The method comprises: preparing a unit cell of a Silicon Carbide (SiC) substrate comprising a first conductivity type substrate and a first conductivity type drift layer; forming a second conductivity type well region; forming a first conductivity type source region within the second conductivity type well region; and forming a second conductivity type shield region surrounding the first conductivity type source region. A portion of the second conductivity type shield region is located on a SiC surface.

In an embodiment, forming the second conductivity type well region comprises: depositing a first mask; etching the first mask and forming a first patterned mask; and performing a first ion implantation using second conductivity type ions through the first patterned mask.

In another embodiment, the first mask comprises at least one of a silicon oxide layer, a polysilicon layer, and a silicon nitride layer.

In yet another embodiment, the first mask comprises a first thickness ranging from 50 nanometers to 5000 nanometers.

In yet another embodiment, the first mask comprises a top silicon oxide layer, and a bottom silicon oxide layer sandwiching a polysilicon layer. The first thickness of the first mask is in a range of 1300 nanometers to 1800 nanometers.

In yet another embodiment, the method further comprises: etching the top silicon oxide layer, and the polysilicon layer of the first mask; forming a remnant thin silicon oxide layer; and performing the first ion implantation using the second conductivity type ions through the remnant thin silicon oxide layer.

In yet another embodiment, the thickness of the remnant thin silicon oxide layer is in the range of 1 nanometer to 200 nanometers.

In yet another embodiment, performing the first ion implantation using the second conductivity type ions comprises performing one or more ion implantations. Each ion implantation of the one or more ion implantations comprises an implantation energy and an implantation dose. The first ion implantation is performed at a temperature in the range of 20 degree Celsius to 1000 degree Celsius. The second conductivity type ions comprise one of Aluminum and Boron. The implantation energy is in a range from 10 kiloelectron volts (keV) to 10 Mega electron volts (MeV). The implantation dose is in a range from 10^12 ions per centimeter squared to 10^15 ions per centimeter squared.

In yet another embodiment, forming the second conductivity type shield region comprises: depositing a second mask over a first patterned mask; etching the second mask with a first etch rate in a vertical direction and a second etch rate in a horizontal direction that is lower than the first etch rate, to form a sidewall spacer over the first patterned mask; and performing a second ion implantation using second conductivity type ions.

In yet another embodiment, depositing the second mask comprises a chemical vapor deposition (CVD) of a silicon oxide layer.

In yet another embodiment, the second mask comprises a second thickness in a range of 200 nanometers to 2500 nanometers.

In yet another embodiment, the sidewall spacer comprises a first width at the SiC surface, a second width at a first height that ranges from 20 percent to 70 percent of a first thickness of a first mask, and a third width at a second height that is equal to the first thickness of the first mask.

In yet another embodiment, the sidewall spacer comprises the first width that is equal to the second width, and the second width is greater than the third width.

In yet another embodiment, the sidewall spacer comprises the first width that is greater than the second width, and the second width is greater than the third width.

In yet another embodiment, performing the second ion implantation using the second conductivity type ions comprises: performing one or more ion implantations. Each ion implantation comprises an implantation energy and an ion implantation dose. The second conductivity type ions comprise one of Aluminum or Boron. The implantation energy is in a range from 50 kiloelectron volts (keV) to 5 Mega electron Volts (MeV).

In yet another embodiment, forming the second conductivity type shield region comprises: forming a first portion of the second conductivity type shield region within the second conductivity type well region. The first portion of the second conductivity type shield region is not directly underneath a first patterned mask and a second patterned mask.

In yet another embodiment, forming the second conductivity type shield region further comprises: forming a second portion of the second conductivity type shield region within the second conductivity type well region. The second portion of the second conductivity type shield region is directly underneath the second patterned mask. The second portion of the second conductivity type shield region connects the first portion of the second conductivity type shield region with the SiC surface.

In yet another embodiment, the first portion of the second conductivity type shield region is deeper than the second conductivity type well region.

In yet another embodiment, the first portion of the second conductivity type shield region is not deeper than the second conductivity type well region.

In yet another embodiment, the second portion of the second conductivity type shield region is closer to an edge of the second conductivity type well region than an edge of the first conductivity type source region.

In yet another embodiment, a device formed comprises one of a metal oxide semiconductor field-effect transistor (MOSFET), a double implantation metal oxide semiconductor field effect transistor (DMOSFET), and an insulated gate bipolar transistor (IGBT).

In yet another embodiment, the first mask comprises a sidewall angle in a range of 45° to 90°.

In yet another embodiment, the second etch rate is equal to zero when the etching performed is perfectly anisotropic etching.

In yet another embodiment, the method further comprises: etching subsequently a silicon oxide layer of the second mask with a third etch rate that is twice as high in the vertical direction as the third etch rate is in the horizontal direction.

In yet another embodiment, a width of the sidewall spacer is controlled by varying a thickness of the second mask and an anisotropy of the etching.

In yet another embodiment, a width of the sidewall spacer varies throughout a thickness of the second mask.

In yet another embodiment, a width of the sidewall spacer comprises a first width, a second width, and a third width, wherein the width of the sidewall spacer is largest at a location of the first width and the width of the sidewall spacer gradually decreases to zero at a location of the third width.

In yet another embodiment, forming the second conductivity type well region further comprises: forming a contact layer for the second conductivity type well region.

In yet another embodiment, forming the contact layer for the second conductivity type well region comprises: performing one or more high dose ion implantations using Aluminum ions over the second conductivity type well region.

In yet another embodiment, the method further comprises: performing an annealing at a temperature ranging from 1600° C.-2000° C.

In yet another embodiment, the method further comprises: forming a silicide layer on an exposed portion of the SiC substrate, wherein a thickness of the silicide layer may range from 10 nanometers to 300 nanometers.

In yet another embodiment, the silicide layer comprises a nickel silicide layer, wherein the nickel silicide layer is formed by rapid thermal annealing of a nickel layer that is deposited by one of a physical vapor deposition (PVD), an electron beam evaporation, and a sputtering process.

In yet another embodiment, the method further comprises: forming an interconnect metal layer over a silicide layer. The interconnect metal layer comprises at least one of Titanium, Titanium Nitride, Titanium Tungsten, Nickel, Aluminum, Silver and Gold.

In yet another embodiment, the interconnect metal layer comprises a stack layer of 50 nanometers of Titanium, 50 nanometers of Titanium Nitride and 4000 nanometers of Aluminum on a topside of the SiC substrate.

In yet another embodiment, the interconnect metal layer comprises a stack layer of 100 nanometers of Titanium, 400 nanometers of Nickel, and 1000 nanometers of Silver on a bottom side of the SiC substrate.

Other features will be apparent from the accompanying drawings and from the detailed description that follows.

BRIEF DESCRIPTION OF THE FIGURES

Colour drawings have been submitted in this application because in figures such as FIG. 3a, FIG. 3b, different colours represent different regions. Further in FIG. 4a, FIG. 4b, FIG. 4c different colours represent different plots of different devices. The variation in colour gives obvious visual cues about how the phenomenon is clustered or varies. Thus, the colour drawing is the only practical medium by which aspects of the claimed subject matter may be accurately conveyed.

In the present disclosure, reference is made to the accompanying drawings, which form a part hereof. In the drawings, similar symbols typically identify similar components, unless context dictates otherwise. Various embodiments described in the detailed description, and drawings, are illustrative and not meant to be limiting. Other embodiments may be used, and other changes may be made, without departing from the spirit or scope of the subject matter presented herein. It will be understood that the aspects of the present disclosure, as generally described herein, and illustrated in the Figures, can be arranged, substituted, combined, separated, and designed in a wide variety of different configurations, all of which are contemplated herein. The embodiments are illustrated by way of example and not limitation in the figures of the accompanying drawings, in which like references indicate similar elements and in which:

FIG. 1b illustrates a unit cell pitch of a device shown in FIG. 1a.

Figure 1A:
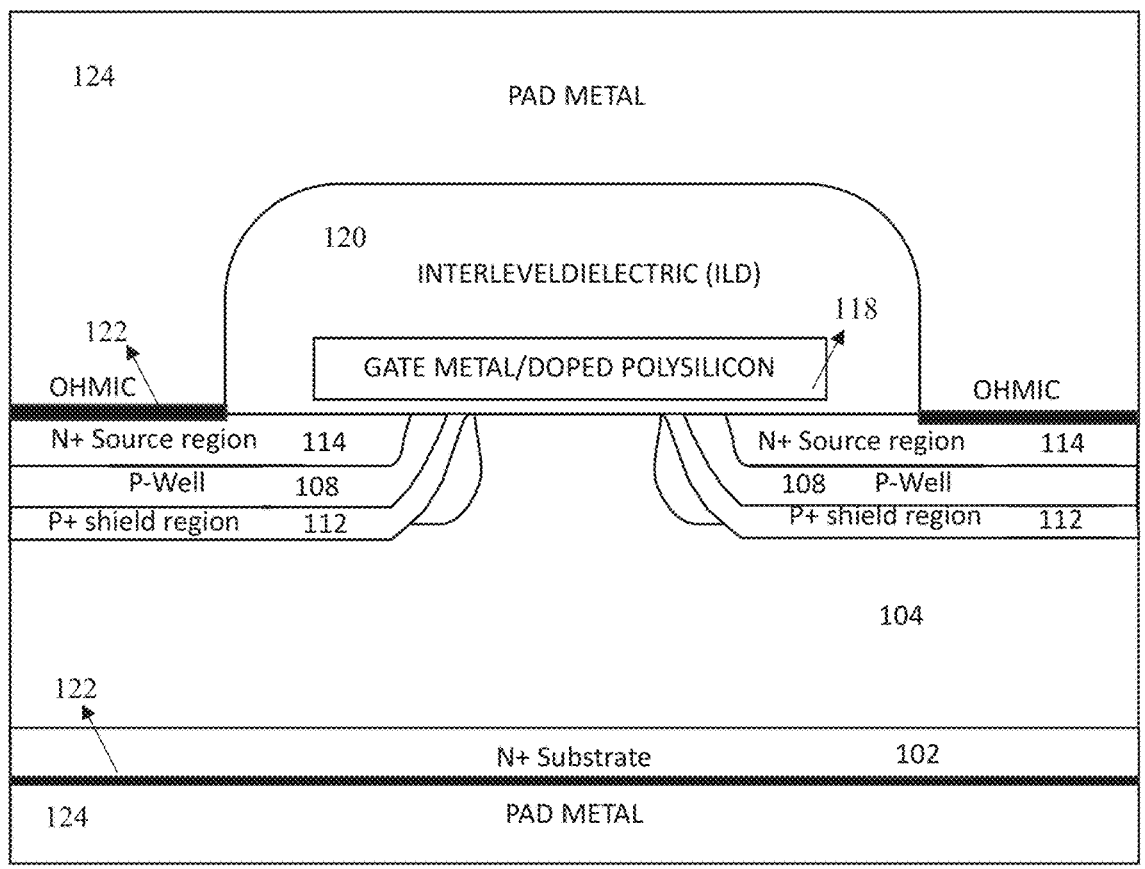
FIG. 1a illustrates a cross section of a device having a shield region surrounding a source region, according to one or more embodiments.

Other features of the present embodiments will be apparent from the accompanying drawings and from the detailed description that follows.

DETAILED DESCRIPTION

Definitions and General Techniques

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of the ordinary skilled in the art to which this disclosure belongs.

The articles "a" and "an" are used herein refers to one or to more than one (i.e., to at least one) of the grammatical object of the article. By way of example, "an element" means one element or more than one element.

No element, act, or instruction used herein should be construed as critical or essential unless explicitly described as such. Also, as used herein, the articles "a" and "an" are intended to include items, and may be used interchangeably with "one or more." Furthermore, as used herein, the term "set" is intended to include items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in this written description, like "comprising" or "including," it is understood that direct support should also be afforded to "consisting essentially of" language as well as "consisting of" language as if stated explicitly and vice versa.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Reference throughout this specification to "an example", "an instance", "for example" means that a particular feature, structure, or characteristic described in connection with the example is included in at least one embodiment. Thus, appearances of the phrases "in an example" in various places throughout this specification are not necessarily all referring to the same embodiment.

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

In an embodiment, the term "unit cell" is the smallest portion of a crystal lattice that shows the three-dimensional pattern of the entire crystal. A crystal can be thought of as the same unit cell repeated over and over in three dimensions. Further "unit cell" refers to a small portion of the crystal that can be used. to reproduce the entire crystal.

The term "SiC" as used herein refers to silicon carbide which is a compound semiconductor and is a mixture of silicon and carbon with the chemical formula SiC. Silicon is covalently bonded with carbon. In 4H—SiC, 4H is written in the Ramsdell classification scheme where the number indicates the layer, and the letter indicates the Bravais lattice. That means in a 4H—SiC structure four hexagonal layers of SiC are present. SiC exists in a kind of polymorphic crystalline building known as a polytype, e.g., 3C—SiC, 4H—SiC, 6H—SiC. Presently 4H—SiC is used in power device manufacturing.

In an embodiment, the term "SiC" refers to silicon carbide. SiC is a compound semiconductor composed of silicon and carbide. SiC provides a number of advantages over silicon, including 10× the breakdown electric field strength, 3× the band gap, and enabling a wider range of p- and n-type control required for device construction.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

In an embodiment, the term "JFET" refers to a lateral spacing between successive p-well regions. Further "JFET" is a FET in which the gate is created by reverse-biased junction (as opposed to the MOSFET which creates a junction via a field generated by conductive gate, separated from the gate region by a thin insulator).

The term "MOSFET" as used herein refers to a metal oxide semiconductor field-effect transistor. which is a four-terminal device with source (S), gate (G), drain (D) and body (B) terminals. The body of the MOSFET is frequently connected to the source terminal making it a three-terminal device like field effect transistor.

In an embodiment, the term "MOSFET" refers to a device in which the conductive channel between the drain and source contacts is controlled by a metal gate separated from the channel by a very thin insulating layer of oxide. The gate voltage establishes a field that allows or blocks current flow.

The term "DMOSFET" as used herein refers to double-implantation metal oxide semiconductor field-effect transistor. A common physical structure of SiC MOSFETs is the planar double-implanted MOSFET in 4H—SiC (SiC-DMOSFET).

In an embodiment, the term "DMOSFET" refers to a device obtained via a double implantation MOS (DIMOS) process having a source, a drain, and a gate terminal.

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

In an embodiment, the term "dopant" refers to any impurity added to a semiconductor for the purpose of modifying its electrical conductivity. Further "dopant" refers to an element or compound which is used to improve the properties of a semiconductor.

The term "drain" as used herein refers to the electrode of a field effect transistor which receives charge carriers which pass through the transistor channel from the source electrode.

In an embodiment, the term "drain" refers to a collecting terminal in which the majority charge carriers enter and thus contribute to the conduction procedure.

The term "source" as used herein refers to the active region/electrode to which the source of charge carriers is connected in a field effect transistor.

In an embodiment, the term "source" refers to a terminal through which the majority charge carriers are introduced in the FET.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

In an embodiment, "gate" is formed by diffusion of a type of semiconductor with another type of semiconductor. Gate basically creates a high impurity region which controls the flow of the carrier from source to drain. Further Gate is a controlling terminal of a FET. A voltage on the gate controls the current flow between the source and drain.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

In an embodiment, the term "impurity" refers to an element added to a semiconductor which allows control of the conductivity of the semiconductor.

The term "PN junction" as used herein refers to the interface and region of transition between p-type and n-type semiconductors.

In an embodiment, the term "PN junction" refers to an interface or a boundary between two semiconductor material types, namely the p-type and the n-type, inside a semiconductor. The p-side or the positive side of the semiconductor has an excess of holes and the n-side or the negative side of the semiconductor has an excess of electrons. The term "PN junction" further refers to a junction that is formed by combining the n-type and the p-type semiconductors. The term junction refers to the interface where the two types of semiconductors meet.

The term "polysilicon" as used herein refers to a polycrystalline form of silicon.

The term "p-type" as used herein refers to extrinsic semiconductor in which the hole density exceeds the conduction electron density.

In an embodiment, the term "p-type" refers to a type of a semiconductor type which has an excess of holes.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

In an embodiment, the term "bandgap" refers to a minimum energy required to excite an electron that is stuck in its bound state into a free state where it can participate in conduction. The band gap further represents the minimum energy difference between the top of the valence band and the bottom of the conduction band.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage, and the device behaves as if it had negative electrical resistance.

The term "channel" as used herein refers to a path for conducting current between a source and drain of a field effect transistor.

In an embodiment, the "channel" referred herein is a MOSFET channel. The channel further refers to an interface formed between an edge of the P-well region and an edge of the source region.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

In an embodiment, the term "chip" refers to a circuit with many components such as transistors and wiring formed on a semiconductor wafer. An electronic device comprising numerous of these components is called an "integrated circuit (IC)".

The term "contact" as used herein refers to the point or part of a conductor which touches another electrical conductor or electrical component to carry electrical current to or from the conductor or electrical component.

In an embodiment, the term "contact" refers to a connection between two conductors that allows an electric current to flow.

The term "die" as used herein refers to a tiny piece of semiconductor material, separated from a semiconductor slice, on which one or more active electronic components are formed. It is sometimes called a chip.

In an embodiment, the term "die" refers to a small block of semiconducting material on which a given functional circuit is fabricated. The wafer is cut (diced) into many pieces, each containing one copy of the circuit. Each of these pieces is called a die. Die may also refer to a rectangular pattern on a wafer containing circuitry to perform a specific function.

The term "sinker" as used herein refers to deep implanted regions at key locations within the DMOSFET structure.

In an embodiment, the term "sinker" refers to a buried electrically conductive, low resistance path in an integrated circuit which connects an electrical contact to a conductive region buried in the integrated circuit. The sinker may be made up of a heavily doped impurity region.

The term "plug" as used herein refers to the structure used to ground the well and the source contact.

In an embodiment, the term "plug" refers to a vertical connection between metal lines in a multilevel interconnect scheme.

The term "drift layer" as used herein refers to lightly doped region to support the high voltage in power MOSFET The term "well" used herein refers to certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "source interconnect metallization" as used herein refers to interconnection metallization that interconnects many MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

In an embodiment, the term "self-aligned" refers to formation of precise alignment of a region with another region while performing lithographic stages of integrated circuit fabrication without any specific steps involved for alignment.

The term "device" as used herein refers to the physical realization of an individual electrical element in a physically independent body which cannot be further divided without destroying its stated function.

In an embodiment, the term "device" refers to an object or thing made for a particular purpose.

The term "surface" as used herein refers to the outer or exterior boundary of a thing.

In an embodiment, the term "surface" refers to an outside part or an outermost layer of an object or thing.

The term "trench" as used herein refers to electrical isolation of electronic components in a monolithic integrated circuit by the use of grooves or other indentations in the SiC surface, which may or may not be filled with electrically insulative (i.e., dielectric) material.

In an embodiment, the term "trench" refers to a recessed region in a surface of the substrate. The trench may be a hollow depression. The trench described herein may comprise a silicide layer in contact with the trench region. The recessed region may be formed by etching the SiC surface.

The term "dielectric" as used herein refers to a non-conductor of electricity, otherwise known as an insulator.

In an embodiment, the term "dielectric" refers to a non-metallic material having insulating properties.

The term "mobility" as used herein refers to the facility with which carriers move through a semiconductor when subjected to an applied electric field. Electrons and holes typically have different mobilities in the same semiconductor.

In an embodiment, the term "mobility" as used herein refers to the mobility of charge carriers in a current carrying conductor. The term mobility is defined as the net average velocity with which the free-electrons move towards the positive end of a conductor under the influence of an external electric field that is being applied.

The term "RIE" as used herein refers to reactive ion etching which is an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it.

In an embodiment, the term "reactive ion etching (RIE)" is a high-resolution mechanism for etching materials using reactive gas discharges. It is a highly controllable process that can process a wide variety of materials, including semiconductors, dielectrics and some metals. One major advantage to RIE over other forms of etching is that the process can be designed to be highly anisotropic, allowing for much finer resolution and higher aspect ratios. Further Reactive Ion Etching (or RIE) is a simple operation and an economical solution for general plasma etching. A single RF plasma source determines both ion density and energy.

The term "ILD" as used herein refers to interlayer dielectric, a dielectric material used to electrically separate closely spaced interconnect lines arranged in several levels (multi-level metallization) in an advanced integrated circuit.

In an embodiment, the term "interlayer dielectric (ILD)" is a dielectric layer may be formed from, for example, a low-k dielectric material (with k<4.0), including but not limited to, silicon oxide, a flowable oxide, a high-density plasma oxide, borophosphosilicate glass (BPSG), or any combination thereof. The ILD may be deposited by a deposition process, including, but not limited to CVD, PVD, plasma enhanced CVD (PECVD), atomic layer deposition (ALD), evaporation, chemical solution deposition, or other processes.

In another embodiment, an interlayer dielectric (ILD) is formed as a barrier layer between a substrate and interconnect structures. The ILD helps to prevent particles in the interconnect structures and inter-metal dielectrics (IMDs) from diffusing into the substrate and therefore reduces the risk of improper functioning of various components formed within the ILD. The ILD is etched to form openings, such as contact holes or trenches, for features which are subsequently metalized to provide a conductive path for electrical signals to connect to the various components.

The term "CVD" as used herein refers to the chemical vapor deposition method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

In an embodiment, the term "Chemical Vapor Deposition (CVD)" is the most common thin film deposition method in advanced semiconductor manufacturing; deposited species are formed as a result of chemical reaction between gaseous reactants at elevated temperature in the vicinity of the substrate; solid product of the reaction is deposited on the surface of the substrate; used to deposit films of semiconductors (crystalline and non-crystalline), insulators as well as metals; variations of CVD processes include Atmospheric Pressure CVD (APCVD), Low Pressure CVD (LPCVD) and Plasma Enhanced CVD (EPCVD), Metal-Organic CVD (MOCVD) and others.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

In an embodiment, the term "Plasma Enhanced Chemical Vapor Deposition, (PECVD)" process of chemical vapor deposition in which species to be deposited are generated in plasma; as a result, deposition using the same source gases is taking place at lower wafer temperature then in conventional CVD which requires high temperature to break bonds and to release desired species from input gases; somewhat lower film quality than in the case of pure thermal Low Pressure Chemical Vapor Deposition (LPCVD).

The term "LPCVD" as used herein refers to low pressure chemical vapor deposition technology that uses heat to initiate a reaction of a precursor gas on the solid substrate. This reaction at the surface is what forms the solid phase material.

In an embodiment, the term "Low Pressure chemical vapor deposition (LPCVD)" refers to a chemical vapor deposition process carried out at reduced pressure; improves conformality of coating and purity of the films as compared to atmospheric pressure CVD (APCVD).

The term "DIBL" as used herein refers to drain induced barrier lowering and is a short-channel effect in MOSFETs referring originally to a reduction of threshold voltage of the transistor at higher drain voltages. In a classic planar field-effect transistor with a long channel, the bottleneck in channel formation occurs far enough from the drain contact that it is electrostatically shielded from the drain by the combination of the substrate and gate, and so classically the threshold voltage was independent of drain voltage. In short-channel devices this is no longer true: The drain is close enough to gate the channel, and so a high drain voltage can open the bottleneck and turn on the transistor prematurely.

The term "p-shield" as used herein refers to a carefully designed p-type doped region strategically located close to or within the MOSFET channel region, with the objective of shielding the MOSFET channel from the high potential applied to the drain terminal during off-state or blocking operation.

In an embodiment, the term "shield region" refers to a region for shielding a channel region and mitigating creation or expansion of a drain-induced depletion region around the channel.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions, respectively.

An embodiment described herein relates to design and manufacturing of a short-channel SiC MOSFET.

An embodiment described herein relates to minimizing the DIBL effect of the high voltage, short-channel SiC MOSFETs.

An embodiment described herein relates to improved device reliability.

An embodiment described herein relates to reducing ON resistance for a given chip size.

An embodiment described herein relates to design and manufacturing MOS channels with sub-micron channel lengths.

The embodiments described herein achieve a device with both low enough ON resistance as well as high enough short circuit withstand time.

The embodiments described herein relate to increasing the doping concentration of the channel locally in certain regions of the channel. The non-uniformly doped channels for SiC MOSFET provide better tradeoff between ON resistance, threshold voltage and short circuit withstand time.

In the embodiments described herein relate to increasing the doping concentration in the channel locally such that they do not increase the threshold voltage too much, but at the same time reduce the DIBL effect to achieve a better trade off.

In an embodiment described herein a p-type shielding layer called the p-shield is formed within the p-well region. The p-shield always originates within the p-well region, but it can extend beyond the vertical extent of the p-well region.

In an embodiment described herein the bottom of the p-shield region can extend beneath the p-well.

In an embodiment described herein there can be multiple p-shield regions. The doping concentrations in the different p-shield regions can be different from each other.

The embodiment described herein relates to a device where a p-shield region is formed buried within the p-well structure. The p-shield region always originates within the p-well region, but can extend beyond the vertical extent of the p-well region.

In an embodiment herein, device structures can have multiple p-shield regions. In these cases, their doping concentration profiles of the different p-shield regions do not necessarily have to be the same and can be different from each other.

In the race to achieve a lower On-stage resistance in planar gate SiC MOSFET, especially with high breakdown voltage ratings, it's a common practice to make the channel lengths as short as possible because this reduces a great part of the conduction loss that is associated with SiC channels. The MOS mobility in SiC MOS structures is significantly smaller as compared to those found in silicon MOSFETS and as a result to achieve a low enough ON resistance, one needs to make the channel lengths quite short and sometimes in the sub-micron range.

As the channel lengths become shorter, short channel effects become a problem in a SiC power MOSFET causing the drain induced barrier lowering effect, also called the DIBL effect which is responsible for a lot of reliability issues in SiC MOSFETs.

One associated problem is a roll off of the threshold voltage at high drain bias where the designed device achieves a certain desired threshold voltage only at very low drain bias. But, as the drain bias approaches its blocking value, the threshold voltage gets reduced substantially which is undesirable since the channel could inadvertently turn on.

Also, a device suffering the DIBL effect has extremely large saturation currents under high drain bias. which results in excessive power dissipation under short circuit load conditions. This results in a low short circuit withstand time. While limited MOS channel mobility of SiC MOSFETS can be overcome with short channel lengths, it is associated with problems due to DIBL effects.

One approach to mitigating this problem is to increase the doping concentration in the channel region which uniformly increases the threshold voltage of the device. While this approach can reduce the saturation drain current, this also increases the ON resistance of the device.

The embodiments described herein can help achieve a device with both low enough ON resistance as well as high gate threshold voltage and high short circuit withstand time. While the conventional approach is to just uniformly increase the doping concentration in the channel region, the embodiments described herein do not increase the doping concentration of the other channel uniformly but increase it locally in certain regions of the channel. The non-uniformly doped channels for SiC MOSFET provide better tradeoff between ON resistance, threshold voltage and short circuit withstand time.

In the embodiments herein the doping concentration is increased such that they do not increase the threshold voltage too much, but at the same time reduce the DIBL effect and hence achieving a better trade off.

In an embodiment herein a p-type shielding layer called the p-shield is formed within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions. The doping concentrations in the different p-shield regions can be different from each other.

In an embodiment herein a p-type shielding layer called the p-shield is formed buried within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions buried in the p-well region. The doping concentrations in the different p-shield regions can be different from each other.

A p-shield region is formed buried within the p-well structure re-enforces the doping of the p-well region locally and provides better shielding of the MOSFET channel at the surface, while minimizing the DIBL effect. In the embodiment described herein since the p-shield is not directly connected to the channel, the p-shield does not change the $V_{TH}$.

FIG. 1a illustrates a cross section of a device having a shield region 112 surrounding a source region 114, according to one or more embodiments. The device described herein comprises a power semiconductor device. The power semiconductor device may be one of a metal oxide semiconductor field-effect transistor (MOSFET), a double implantation metal oxide semiconductor field effect transistor (DMOSFET), an insulated gate bipolar transistor (IGBT) and the like. The device may comprise a silicon carbide (SiC) substrate on top of which the fabrication is performed to form one of the MOSFET or the DMOSFET or the IGBT. The device shown in FIG. 1a is a n-type device. In another embodiment, the device is a p-type device.

The cross section of the device shown in FIG. 1a comprises the source region 114, a well region 108, and the shield region 112. The source region 114 may be a first conductivity type source region. The well region 108 may be a second conductivity type well region and the shield region 112 may be a second conductivity type shield region. The device further comprises a metal oxide semiconductor field-effect transistor (MOSFET) channel. The MOSFET channel refers to a region between an edge of the well region 108 and an edge of the source region 114. The fabrication is performed in such a way that the shield region 112 is self-aligned with the MOSFET channel. The formation of the shield region 112 self-aligned with the MOSFET channel does not require any separate masking step.

The shield region 112 is confined within the well region 108. In an embodiment, the shield region 112 is in contact with the MOSFET channel. In another embodiment, the shield region 112 is completely buried within the well region 108 (i.e., completely buried within the substrate and not in contact with the SiC surface or the MOSFET channel). In yet another embodiment, the shield region 112 is formed closer to the edge of the well region 108 than the edge of the source region 114. In yet another embodiment, a vertical extent of the shield region 112 may be greater than a vertical extent of the well region 108. In another embodiment, the vertical extent of the shield region 112 may be less than the vertical extent of the well region 108. In yet another embodiment, the device may comprise multiple shield regions. In yet another embodiment, the vertical extent of the multiple shield regions may be less than the vertical extent of the well region. In yet another embodiment, the vertical extent of the multiple shield regions may be greater than the vertical extent of the well region. In yet another embodiment, doping concentration profiles of the multiple shield regions are substantially different. In yet another embodiment, doping concentration profiles of the multiple shield regions are not substantially different. The method steps of manufacturing or process of fabrication of the device as shown in FIG. 1a is described below in FIG. 2.

Figure 1B:
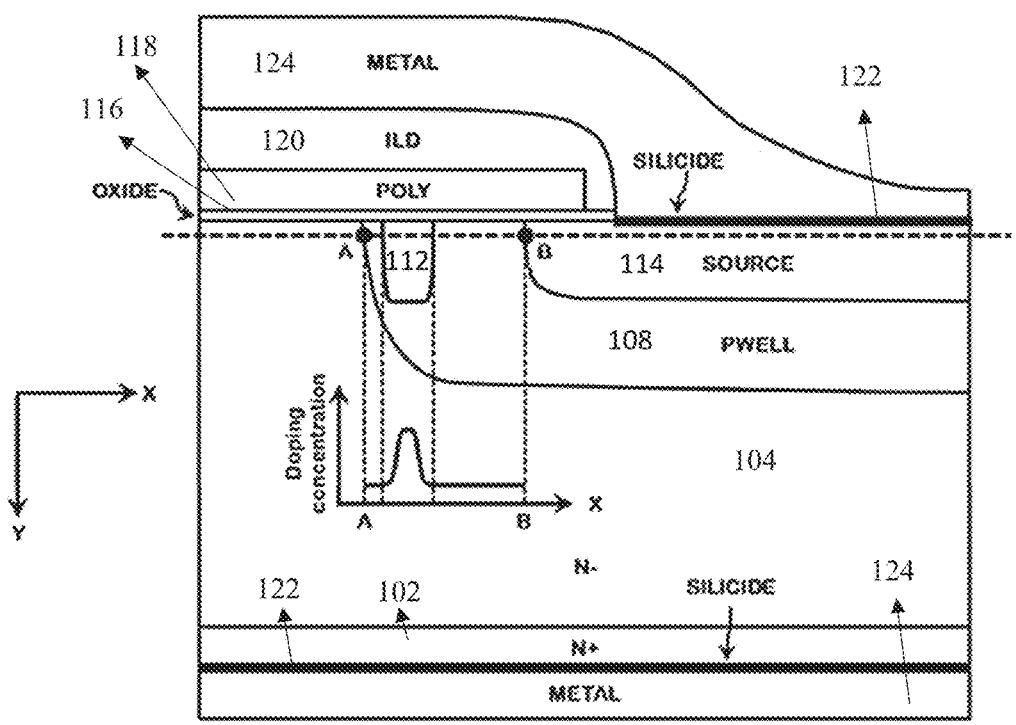

FIG. 1b illustrates a unit cell pitch of a device shown in FIG. 1a. FIG. 1a can be realized by having repetition of the unit cell pitch shown in FIG. 1b. The unit cell pitch comprises a source region 114, a well region 108 and a shield region 112. The unit cell pitch also comprises an oxide layer 116, a polysilicon layer 118, an interlayer dielectric (ILD) layer 120, a silicide layer 122, and an interconnect metal layer 124.

Figure 2A:
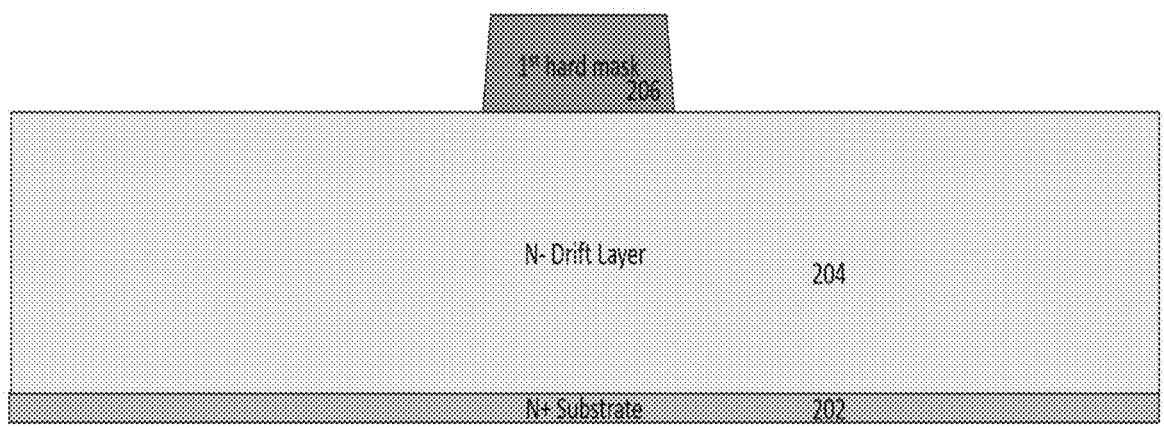
FIGS. 2a-2j illustrates a method of fabrication of a device shown in FIG. 1, according to one or more embodiments.

FIGS. 2a-2j illustrates a method of fabrication of a device shown in FIG. 1, according to one or more embodiments. The method of fabrication comprises preparing a substrate comprising a first conductivity type substrate layer 202 and a first conductivity type drift layer 204. The substrate disclosed herein may be a silicon carbide (SiC) substrate. The preparation of the SiC substrate starts with using a 4H—SiC Si-face epi-wafer with suitable doping ranging from $10^{14}$ to $10^{18}$ cm$^{-3}$ and thickness ranging from 1 micrometer (μm) to 300 micrometers (μm) for the epilayer. The first conductivity type drift layer 204 is a lightly doped layer when compared to the first conductivity type substrate layer 202. Once the SiC substrate is prepared, a first hard mask 206 is deposited at the top side of the first conductivity type drift layer 204 of the SiC substrate. The first hard mask 206 is then patterned to realize the first hard mask 206 for performing well implantation as shown in FIG. 2a. The first hard mask 206 is then patterned using a photolithography process followed by a dry etching using capacitively coupled reactive ion etching (RIE) or inductively coupled plasma (ICP)-RIE.

The first hard mask 206 comprises one of a silicon oxide layer, a silicon nitride layer, a polysilicon layer and a metallic layer. The metallic layer comprises a nickel layer. In another embodiment, the first hard mask 206 comprises a composite layer of at least one of the silicon oxide layer, the silicon nitride layer, and the metallic layer. The first hard mask 206 may be formed using a chemical vapor deposition (CVD). There are different types of CVD that may be used, including but not limited to plasma enhanced chemical vapor deposition (PECVD), atmospheric pressure chemical vapor deposition (APCVD) or low-pressure chemical vapor deposition (LPCVD). In an embodiment, the thickness of the first hard mask 206 may be based on stopping power for masking the ensuing well region, shield region, and source region implantations. In another embodiment, the thickness of the first hard mask 206 may range from 50 nanometers (nm) to 5000 nanometers (nm). The first hard mask 206 comprises a flat top surface, and a side wall. The side wall tapers towards the flat top surface such that a width at the top of the first hard mask is less when compared to a width at the bottom of the first hard mask 206 (i.e., towards the SiC surface).

In an embodiment, the first hard mask 206 may comprise a hard mask stack comprising two silicon oxide layers that sandwiches a polysilicon layer or a silicon nitride layer and the thickness of the first hard mask may range between 1300 nanometers (nm) and 1800 nanometers (nm). Then the hard mask stack is dry etched to the SiC surface to create the first hard mask 206 (i.e., the patterned first hard mask) as shown in FIG. 2a. The first hard mask 206 comprises the flat top surface, and the sloping side wall. The sloping side wall tapers towards the flat top surface such that the width at the top of the first hard mask 206 is less when compared to the width at the bottom of the first hard mask 206 (i.e., towards the SiC surface). The sidewall angle of the first hard mask layer may be in the range of 45° to 90°. In an embodiment, the top silicon oxide layer and the polysilicon layer of the first hard mask may be etched, while leaving behind a remnant thin silicon oxide layer (e.g., the bottom silicon oxide layer). The thickness of the remnant thin silicon oxide layer is in the range of 1 nanometer to 200 nanometers. The thin silicon oxide layer left may serve as a screen oxide layer, which is typically used to protect the semiconductor surface during ion-implantation.

Figure 2B:
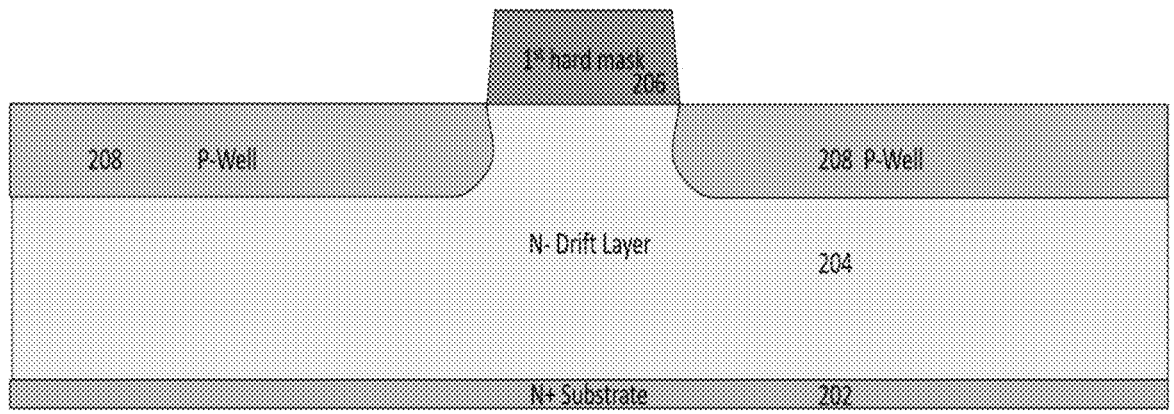

Once the first hard mask 206 is patterned and realized, the ion implantation is performed through the first hard mask 206 to form the well region 208 as shown in FIG. 2b. In an embodiment, the ion implantation is performed using second conductivity type ions to form the well region 208 (i.e., the second conductivity type well region or the p-well region). The ion implantation for forming the well region 208 is performed using the second conductivity type ions comprising one of Aluminum and Boron. The ion implantation performed for forming the well region 208 may comprise an implantation energy ranging from 10 kiloelectron volts (keV) to 10 mega electron volts (MeV) and implantation dose ranging from $10^{12}$ cm$^{-2}$ to $10^{15}$ cm$^{-2}$. In an embodiment, the ion implantation is performed as a single step ion implantation. In another embodiment, the ion implantation for forming the well region 208 is performed as a chained ion implantation.

The chained ion implantation may be performed using different Aluminum ions implanted at different implantation energies and at different implantation doses. The ion implantation for performing the well region 208 may be performed at an elevated temperature to minimize ion-implant induced lattice damage. The elevated temperature may be in the range of 20 degree Celsius to 1000 degree Celsius. Once the ion implantation is performed, the well region 208 is formed below the SiC surface and in contact with lateral edges of the first hard mask as shown in FIG. 2b. The well region 208 comprises a side wall which is slightly curved due to the sloping side wall of the first hard mask 206. In another embodiment, the well region is formed by an epitaxial growth using the second conductivity type ions of one of Aluminum and Boron.

Figure 2C:
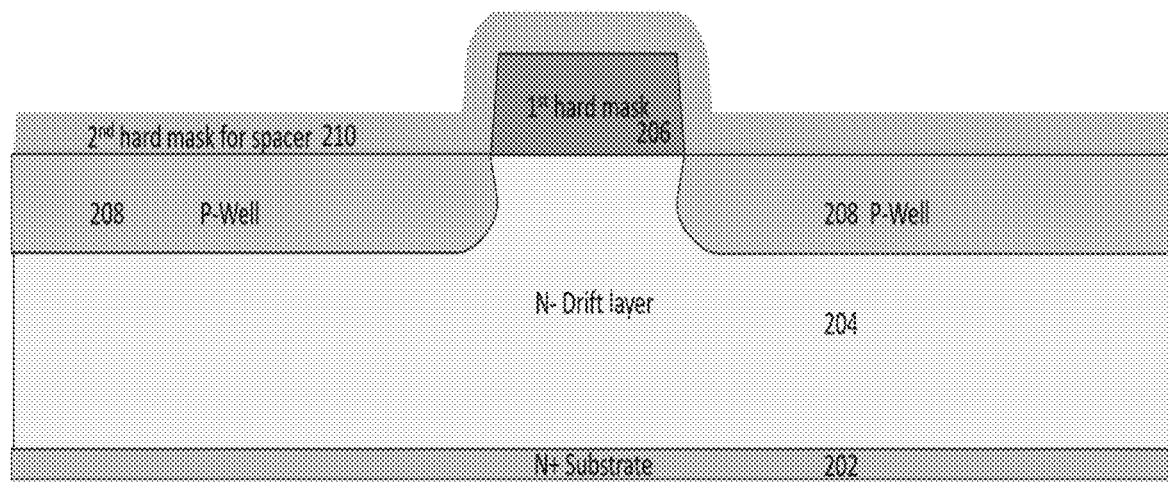

Once the well region 208 is formed, a second hard mask 210 is deposited on top of the first hard mask 206. The thickness of the second hard mask 210 plays a critical role in deciding the location where the shield region 212 is formed which in turn impacts the functioning of the device. As shown in FIG. 2c, the second hard mask 210 comprises a thickness that is either less than or greater than the thickness of the first hard mask 206. In an embodiment, the second hard mask 210 comprises the thickness in the range of 100 nanometers to 1100 nanometers. In another embodiment, the second hard mask 210 comprises the thickness in the range of 1100 nanometers to 2500 nanometers. The second hard mask 210 may constitute a chemical vapor deposition (CVD) deposited layer. The second hard mask 210 may comprise a silicon oxide layer deposited via CVD. A conformal (isotropic) deposition process of the second hard mask layer will result in formation of rounded corners of the second hard mask over the dry etched first hard mask layer. The second hard mask 210 may then be etched with a first etch rate in a vertical direction and a second etch rate in a horizontal direction that is lower than the first etch rate, to form a sidewall spacer over the first patterned mask. The second etch rate may equal zero in an extreme case of perfectly anisotropic etching. As one example, a 1000 nanometer thick layer of silicon oxide is deposited. The silicon oxide layer is subsequently etched via an etch process that has an etch rate that is twice as high in the vertical direction as it is in the lateral direction. Consequently, after the completion of the dry etch process of the second hard mask layer, the width of the first mask layer is effectively increased by 500 nanometers per side, in this example. In other words, it can be said that a sidewall spacer with a width of 500 nanometers is formed by this process. It can be inferred from the preceding discussion that the width of the sidewall spacer can be controlled by the thickness of the second hard mask and the anisotropy of the dry etch process of the second hard mask. The sidewall of the spacer is parallel to the side wall of the first hard mask 206 (i.e., the sidewall spacer formed by the anisotropic etching of the second hard mask 210 follows the sidewall angle of the first hard mask 206). The sidewall spacer formed by the anisotropic etching of the second hard mask 210 comprises a first width (or extension of the first patterned hard mask width) at the SiC surface, a second width at a first height that ranges from 20 percent to 70 percent of the first thickness of the first hard mask 206 and a third width at a second height that is equal to the first thickness of the first hard mask 206. In an embodiment, the sidewall spacer comprises the first width that is equal to the second width, and the second width is greater than the third width. In another embodiment, the sidewall spacer comprises the first width that is greater than the second width, and wherein the second width is greater than the third width. In another embodiment, the third width may be equal to zero. In yet another embodiment, the width of the sidewall spacer varies throughout the thickness of the hard mask: The sidewall spacer width is largest at the location of the first width and it gradually decreases to zero at the location of the third width. The second hard mask 210 further comprises horizontal extents that are adjoined with the sidewall spacer of the second hard mask 210.

The lateral extents are formed parallel to the SiC surface and above the SiC surface. The flat top surface of the second hard mask 210, at this instant, is parallel to the flat top surface of the first hard mask 206 and above the SiC surface.

In one embodiment, the thickness of the first hard mask 206 may be 1700 nanometers (nm) and the thickness of the second hard mask 210 may be 1000 nanometers (nm), for example.

Figure 2D:
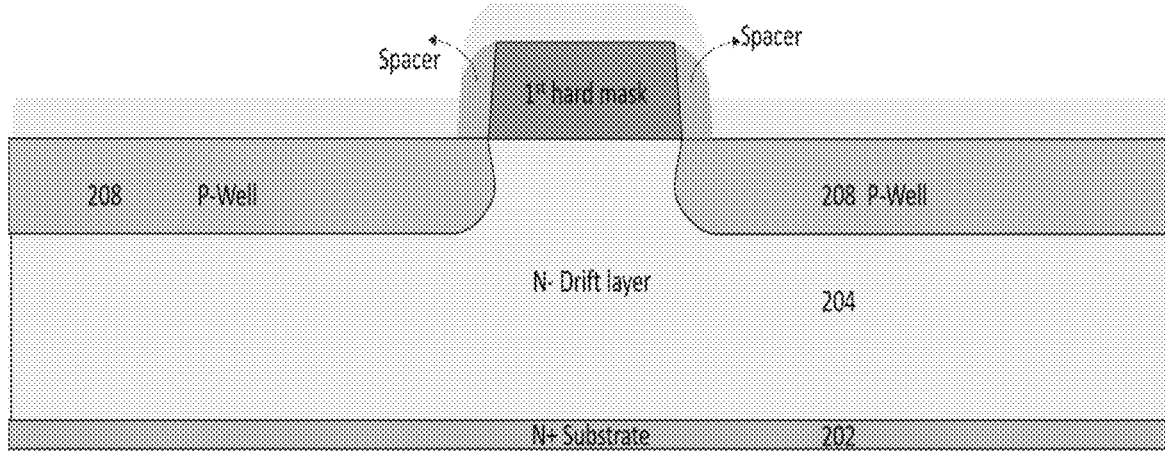

The second hard mask 210 is then anisotropically dry etched to the SiC surface. The anisotropic dry etching simply translates downwards the second hard mask 210, as shown in FIG. 2d, and there is no loss in lateral dimensions of the second hard mask 210. The downward translation of the second hard mask 210 makes the flat top surface of the second hard mask 210 coincide with the flat top surface of the first hard mask 206. The downward translation of the second hard mask 210 further makes the horizontal extents of the second hard mask 210 coincide with the SiC surface. Prior to anisotropic dry etching, the horizontal extents of the second hard mask 210 are located above and parallel the SiC surface. If the dry etching performed is not perfectly anisotropic then there is loss in the lateral dimensions of the second hard mask 210. Considering the loss in the lateral dimensions, the thickness of the second hard mask 210 has to be decided and deposited.

Figure 2E:
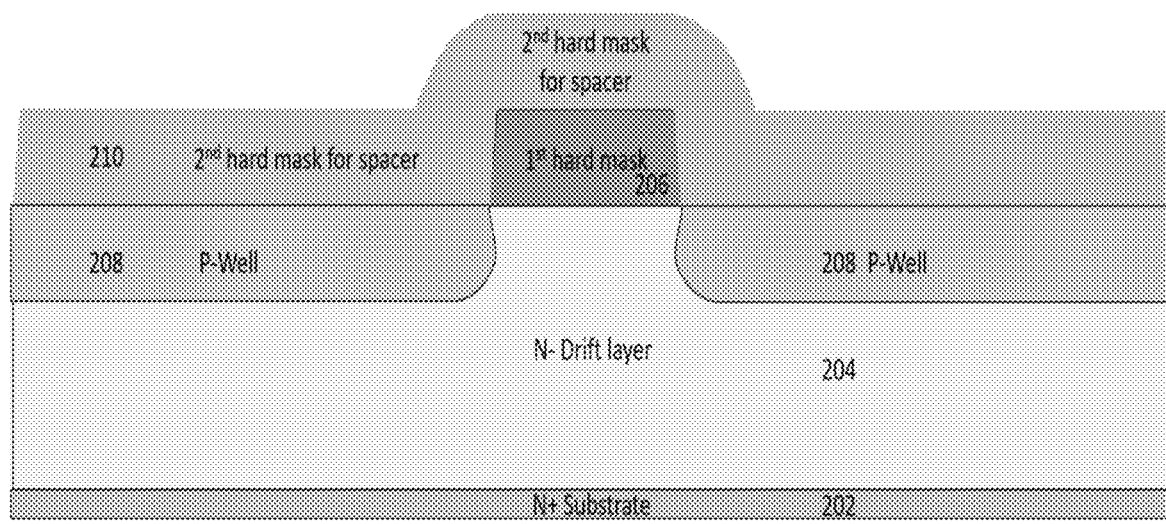

In a different embodiment, the second hard mask 210, that is deposited, comprises the thickness almost equal to the thickness of the first hard mask 206 as shown in FIG. 2e. The thickness of the second hard mask 210 plays a critical role in this embodiment and impacts the functionality of the device. The thickness of the second hard mask 210 chosen decides the location where the shield region 212 is formed. The second hard mask 210 shown in FIG. 2e comprises the thickness almost equal to the thickness of the first hard mask 206. In an embodiment, the thickness of the first hard mask 206 ranges between 1300 nanometers (nm) and 1800 nanometers (nm) and the thickness of the second hard mask 210 comprises 1500 nanometers (nm). In another embodiment, the thickness of the first hard mask 206 comprises 1700 nanometers (nm) and the thickness of the second hard mask 210 comprises 2000 nanometers (nm). The second hard mask 210 shown in FIG. 2d comprises rounded corners and flat top surface. The flat top surface of the second hard mask 210 is located above and parallel to the flat top surface of the first hard mask 206. The second hard mask 210 further comprises a sidewall spacer whose thickness varies throughout its lateral extent. In other words, the second hard mask 210 comprises the sidewall spacer that does not have a constant lateral extent. The second hard mask 210 further comprises horizontal extents that are adjoined to the bottom of the sidewall spacer. The horizontal extents are located above and parallel to the SiC surface.

Figure 2F:
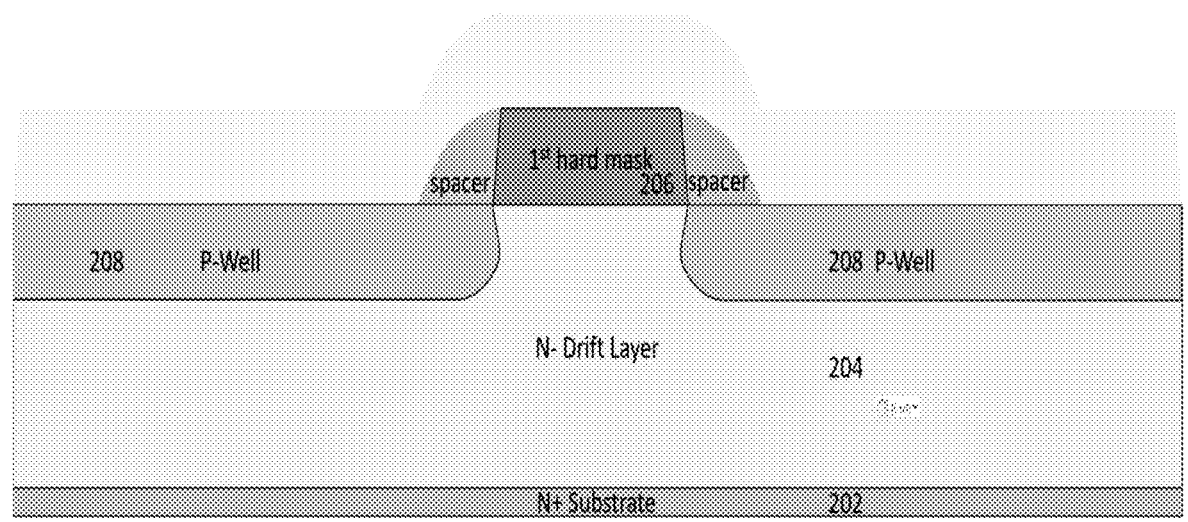

The second hard mask 210 is then anisotropic dry etched to the SiC surface as shown in FIG. 2f. The anisotropic dry etching performed on the second hard mask 210 simply translates downwards the second hard mask 210. The downward translation of the second hard mask 210, obtained by performing the anisotropic etching, makes the flat top surface of the second hard mask 210 coincide with the flat top surface of the first hard mask 206. The downward translation further makes the horizontal extents of the second hard mask 210 coincide with the SiC surface as shown in FIG. 2f. If the anisotropic etching performed is not perfectly anisotropic then there is loss in lateral dimensions of the second hard mask 210. Considering the loss in lateral dimension, the thickness of the second hard mask 210 is decided and deposited.

The second hard mask 210 can be patterned and realized by following the process steps as illustrated in FIG. 2c and FIG. 2d or FIG. 2e and FIG. 2f. The second hard mask 210 is patterned to perform ion implantation for the formation of the shield region. The ion implantation performed for forming the shield region 212 is done using the second conductivity type ions. The second conductivity ions comprise one of Aluminum and Boron ions. The ion implantation performed for forming the shield region 212 is done with an implantation energy ranging from 100 kiloelectron volts (keV) and 5 mega electron volts (MeV). In an embodiment, the implantation energy may be ranging from 300 kiloelectron volts (keV) to 5 Mega electron Volts (MeV). The shield region 212, performed via the ion implantation as described above, comprises a first portion of the shield region 212 buried within the SiC substrate at a first region (i.e., at a place which is not directly underneath the first hard mask 206 and the second hard mask 210) that is not directly underneath the composite hard mask stack as shown in FIG. 2f. In an embodiment, the first portion of the shield region 212 is deeper than the well region 208. In another embodiment, the first portion of the shield region 212 is not deeper than the well region 208. The shield region 212 further comprises a second portion of the shield region 212 that excavates from within the SiC substrate to the surface of the SiC substrate (i.e., the buried shield region emerges towards the SiC surface). The second portion of the shield region 212 formed at a second region (i.e., at a place which is directly underneath the second patterned mask) where the sidewall spacer of the second hard mask 210 exists as shown in FIG. 2f. The second portion connects the first portion of the shield region 212 with the SiC surface. The shield region 212 further comprises a third portion of the shield region 212 buried within the first hard mask 206 above the SiC surface at a region where the first hard mask 206 exists as shown in FIG. 2f.

The shape of the sidewall spacer of the second hard mask 210 directly impacts the location, and shape of the shield region 212. In an embodiment, the shape of the sidewall spacer of the second hard mask 210 is adjusted to predefine the location and the shape of the shield region 212. A portion of the shield region 212 is located on a SiC surface. The shield region 212 continuously (i.e., uninterruptedly) emerges from within the SiC substrate to the SiC surface. The implantation energy imparted in the formation of the shield region 212 impacts the location where the shield region 212 buried emerges to the SiC surface. In an embodiment, the implantation energy is adjusted to predefine the location where the shield region 212 should emerge to the SiC surface.

Figure 2G:
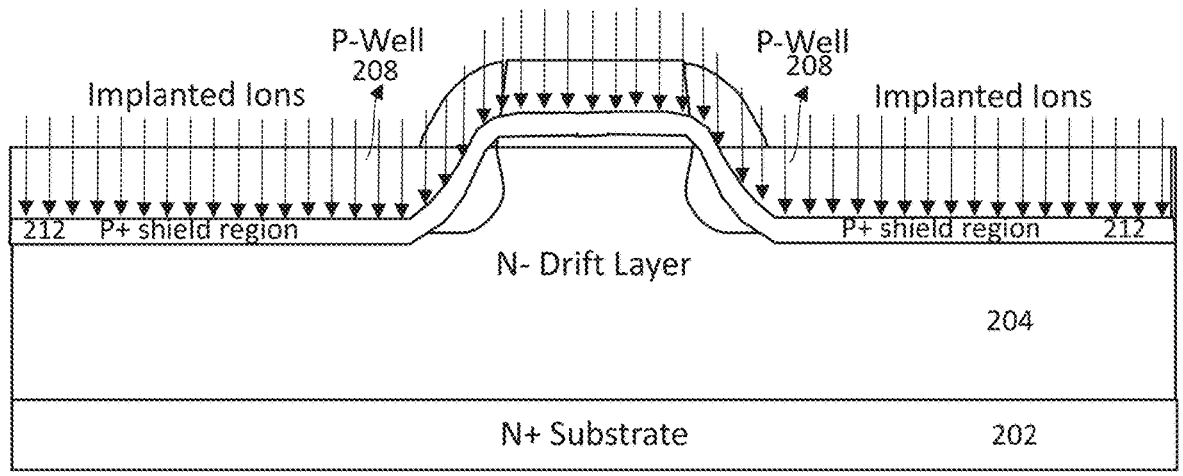
Figure 2H:
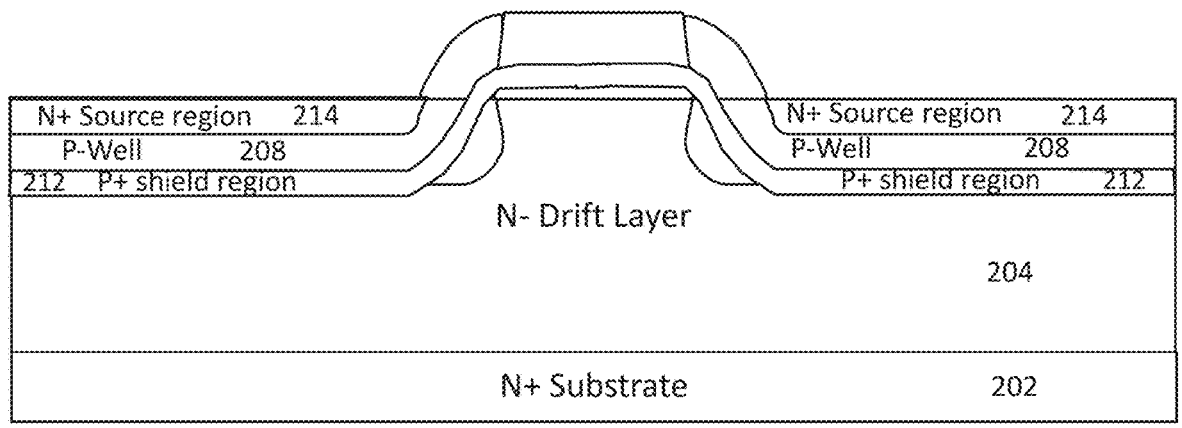
Figure 2I:
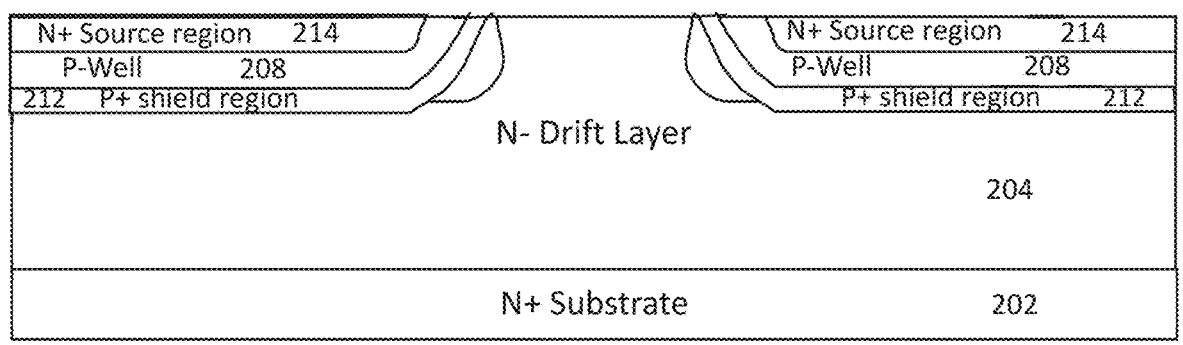

Once the shield region 212 is fabricated, the source region 214 is then formed as illustrated/shown in FIG. 2g. The source region 214, described herein, is a first conductivity type source region. The source region 214 is formed via an ion implantation performed using first conductivity type ions. The first conductivity type ions comprise one of Nitrogen and Phosphorous. An implantation energy imparted for forming the source region 214 comprises 10 kiloelectron volts (keV) to 1000 kiloelectron volts (keV). An implantation dose imparted for forming the source region 214 may range from 1e13 cm-3 to 5e16 cm-3. The ion implantation performed for forming the source region 214 may be one of a single step ion implantation process and a chained ion implantation process. The chained ion implantation process may be performed with different implantation energies and different implantation doses combination to realize a "box-shaped" doping profile of the source region 214. A lateral distance between an edge of the source region 214 and an edge of the well region 208 constitutes a metal oxide semiconductor field-effect transistor (MOSFET) channel. The MOSFET channel formed is self-aligned between the edge of the well region 208 and the edge of the source region 214.

In an embodiment, the device may comprise multiple shield regions. The multiple shield regions may be formed via the method steps as described above. The multiple shield regions may comprise different doping concentration profiles. The doping concentration profiles of the multiple shield regions may be substantially different from each other. The doping concentration profiles of the multiple shield regions may not be substantially different from each other. In an embodiment, the multiple shield regions emerge to the SiC surface. In another embodiment, the multiple shield regions are completely buried with the SiC substrate (i.e., the multiple shield regions do not emerge to the SiC surface). In another embodiment, the multiple shield regions are self-aligned and closer to an edge of the well region 208 than to an edge of the source region 214. As the multiple shield regions are self-aligned via the above steps, no separate masking step is performed. The multiple shield regions are self-aligned and between the edge of the well region 208 and the edge of the source region 214. The locations of the multiple shield regions may be desirably chosen for providing the best trade-offs in device performance, as will be appreciated by a person having ordinary skill in the art (PHOSITA) and a person skilled in the art (PSITA).

Once the shield region 212 and the source region 214 are fabricated, the composite hard mask stack is removed. The removal of the composite hard mask completely removes the shield region 212 formed above the SiC surface and leaves the shield region 212 connected to the SiC surface. The second portion of the shield region 212 that is exposed to the SiC surface is positioned within the MOSFET channel. The second portion of the shield region 212 that is exposed to the SiC surface provides means to directly control the VTH of the MOSFET devices due to its position within the channel region. The second portion of the shield region 212 suppresses DIBL (drain-induced barrier lowering) triggered VTH lowering and enhances the blocking performance of the device at the same time.

Additional ion-implantation steps may be performed in addition to the aforementioned steps for forming the p-well and the Source Implantation. These may include but are not limited to other high-dose Aluminum implantation step/s for forming a contact layer for the p-well region and nitrogen (or phosphorus) implantation step/s for locally increasing the n-type doping concentration in the JFET regions of the SiC MOSFET devices.

After the ion-implantation steps are performed, high-temperature annealing at temperatures ranging from 1600-2000° C. is typically performed for electrical activation of the ion-implanted regions and for alleviating the implant-induced lattice damage to the SiC wafers. A sacrificial oxide may then be grown to remove a portion of the SiC surface damaged by the previous implantation and high-temperature processing.

Figure 2J:
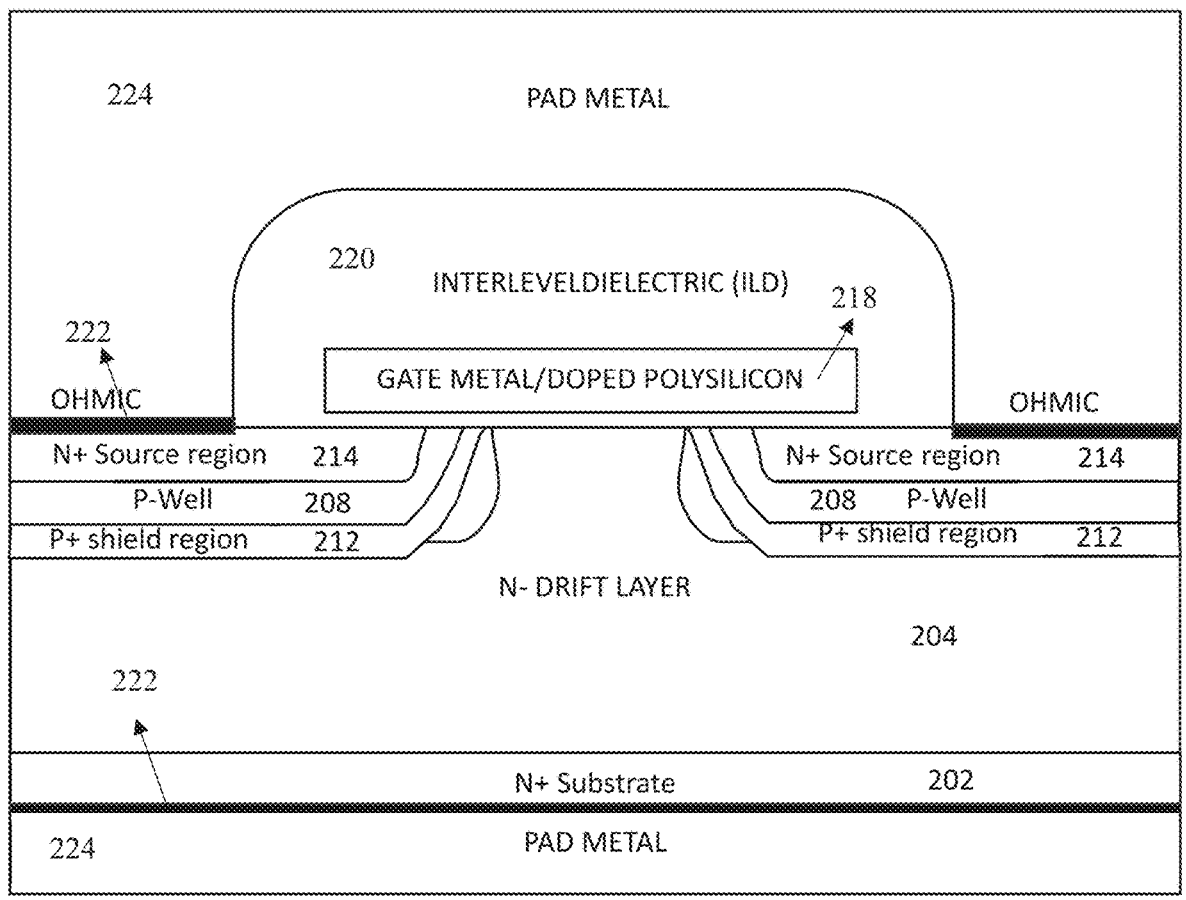

Subsequently, an oxide layer 216 (e.g., gate oxide) is formed as shown in FIG. 2j. The oxide layer 216 is formed by one of a thermal oxidation, and a chemical vapor deposition (CVD) of a dielectric layer such as a silicon oxide layer, a silicon nitride layer, and a silicon oxynitride layer. The thickness of the gate oxide ranges from 10 nm to 100 nm. The oxide layer 216 is formed by one of dry thermal oxidation, and wet thermal oxidation. The oxide layer 216 deposition may also be performed by one of a Plasma-enhanced chemical vapor deposition (PECVD) process, and a low-pressure chemical vapor deposition (LPCVD) process. The gate oxide layer may be preferably subjected to a nitridation annealing process for reducing the density of the carrier recombination centers located at the gate oxide-SiC interface.

A polysilicon layer 218 is then deposited on top of the gate oxide. The polysilicon layer 218 is deposited by one of the Plasma-enhanced chemical vapor deposition (PECVD) process, and the low-pressure chemical vapor deposition (LPCVD) process. The polysilicon layer 218 is then degenerately doped using one of Boron and Phosphorus. The doping is done either one of in-situ doping and a subsequent step doping. In-situ doping may be performed by the addition of Phosphine (PH3) precursor to the polysilicon deposition. The post-deposition doping of the polysilicon may be performed by depositing a layer of Phosphorus Oxychloride ($POCl_3$) followed by a drive-in step at temperatures ranging from 700-900° C. The polysilicon layer 218 is then patterned by dry etching. After dry etching, the polysilicon gate metal layer may be subjected to an optional dry or wet oxidation process to round any sharp corners that may focus the electric field in the gate oxide directly underneath the sharp corners of the gate metal. The polysilicon oxidation process may be conducted at a temperature ranging from 850° C. to 1100° C., in $O_2$ or steam ambient for a duration ranging from 10 min to 4 hours. An interlayer dielectric (ILD) layer 220 is deposited on top of the polysilicon layer 218 as shown in FIG. 2j. The ILD layer 220 comprises 50 nm to 1000 nm thick of one of a silicon oxide layer, a silicon nitride layer, and a silicon oxynitride layer or a stacked combination of the above is deposited on the SiC wafer. Then the ILD layer 220 is patterned to expose portions of the SiC substrate and to form an ILD opening. The oxide layer 216 is also then patterned as shown in FIG. 2j. A silicide layer 222 is then formed on the exposed portions of the topside of the SiC substrate. The silicide layer 222 formed herein may be a nickel silicide region. The thickness of the silicide layer may range from 10 nanometers to 300 nanometers. In one example, the nickel silicide layer may be formed by rapid thermal annealing of a nickel layer that is deposited by physical vapor deposition (PVD), by electron beam evaporation or by sputtering. The silicide layer 222 is also formed on the bottom of the first conductivity type substrate layer 202. An interconnect metal layer 224 (e.g., pad metal) is then formed over the silicide layer 222 on the top and the bottom of the SiC substrate as shown in FIG. 2j. The interconnect metal layer 224 may be formed by depositing at-least one of Titanium, Titanium Nitride, Titanium Tungsten, Nickel, Aluminum, Silver and Gold and patterning the deposited layer. As one example, a stack of 50 nanometers of Titanium, 50 nanometers of Titanium Nitride and 4000 nanometers of Aluminum may be deposited on the top of the SiC substrate, and a stack comprising 100 nanometers of Titanium, 400 nanometers of Nickel and 1000 nanometers of Silver may be deposited on the bottom of the SiC substrate.

Figures 3A, 3B:
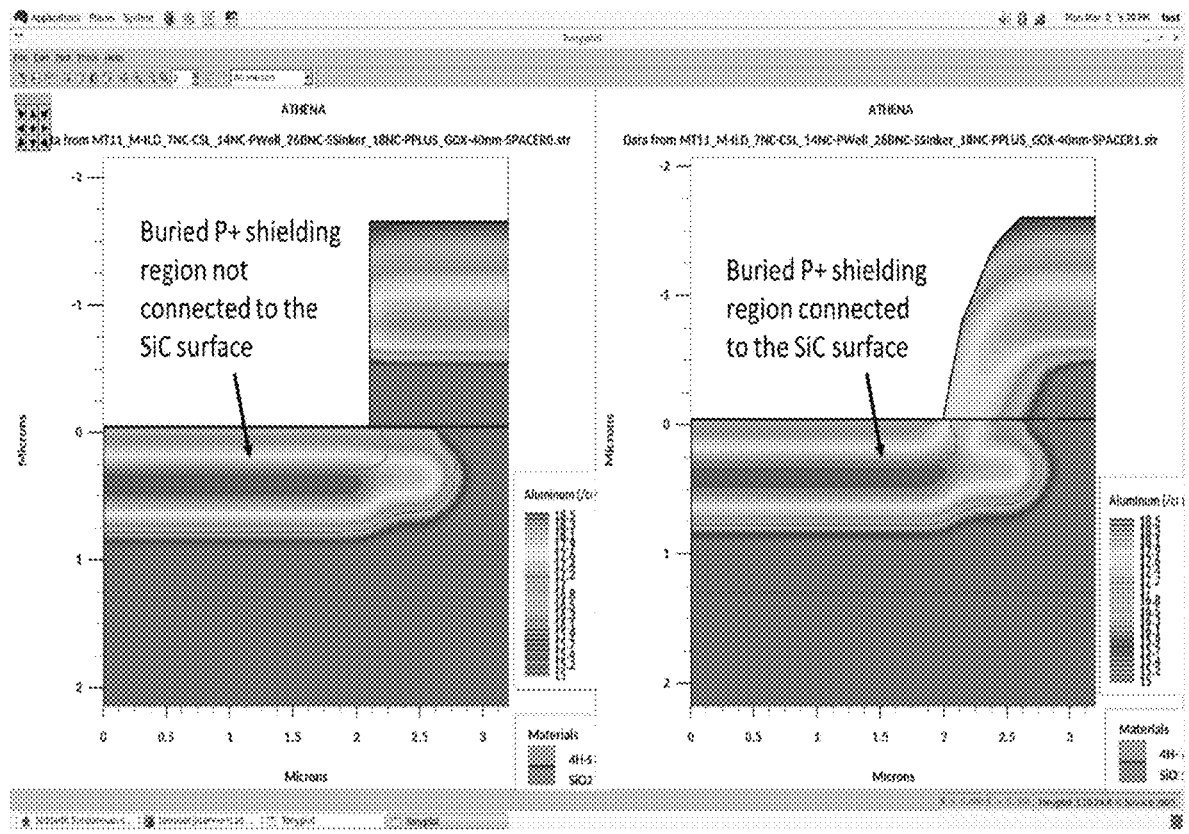
FIG. 3a illustrates a Technology Computer Aided Design (TCAD) simulation showing realization of a shield region in case of a vertical sidewall spacer, according to one or more embodiments.
FIG. 3b illustrates a Technology Computer Aided Design (TCAD) simulation showing realization of a shield region in case of a sloped sidewall spacer, according to one or more embodiments.

FIG. 3a illustrates a Technology Computer Aided Design (TCAD) simulation showing realization of a shield region in case of a vertical sidewall spacer, according to one or more embodiments. The composite hard mask (i.e., a first hard mask, and a second hard mask) shown in FIG. 3a comprises the vertical sidewall spacer. An ion implantation is then performed via the sidewall spacer, which is vertical (i.e., 90 degree or around 90 degree), to form the shield region as shown in FIG. 3a. The shield region comprises a first portion buried within the SiC surface at a first region which is not directly underneath the composite hard mask stack. The shield region comprises a third portion formed above the SiC surface and within the composite hard mask stack. As the sidewall spacer is vertical, the shield region suddenly and non-contiguously formed above the SiC surface within the composite hard mask. The first portion and the third portion of the shield region are isolated (i.e., non-contiguous) in this embodiment. Further the shield region is not in contact with the SiC surface as shown in FIG. 3a. Upon removing the composite hard mask stack, the shield region formed within the composite hard mask also gets removed and only the shield region buried within the shield region is left.

FIG. 3b illustrates a Technology Computer Aided Design (TCAD) simulation showing realization of a shield region in case of a sloped sidewall spacer, according to one or more embodiments. A composite hard mask (i.e., a first hard mask, and a second hard mask) shown in FIG. 3b comprises the sloped sidewall spacer. An ion implantation is then performed via the sloped sidewall spacer to form the shield region as shown in FIG. 3b. The shield region comprises a first portion buried within the SiC surface at a first region which is not directly underneath the composite hard mask stack. The shield region comprises a second portion that emerges to the SiC surface at a second region. The second region is directly underneath the second patterned hard mask. The second portion of the shield region is in contact with the SiC surface. The shield region comprises a third portion formed above the SiC surface and within the composite hard mask stack. As the composite hard mask comprises the sloped sidewall spacer the shield region contiguously and gradually excavates from within the SiC substrate to above the SiC surface. Upon removing the composite hard mask stack, the shield region formed within the composite hard mask (i.e., above the SiC surface) gets removed and only the shield region comprising the first portion and the second portion is left.

Figure 4A:
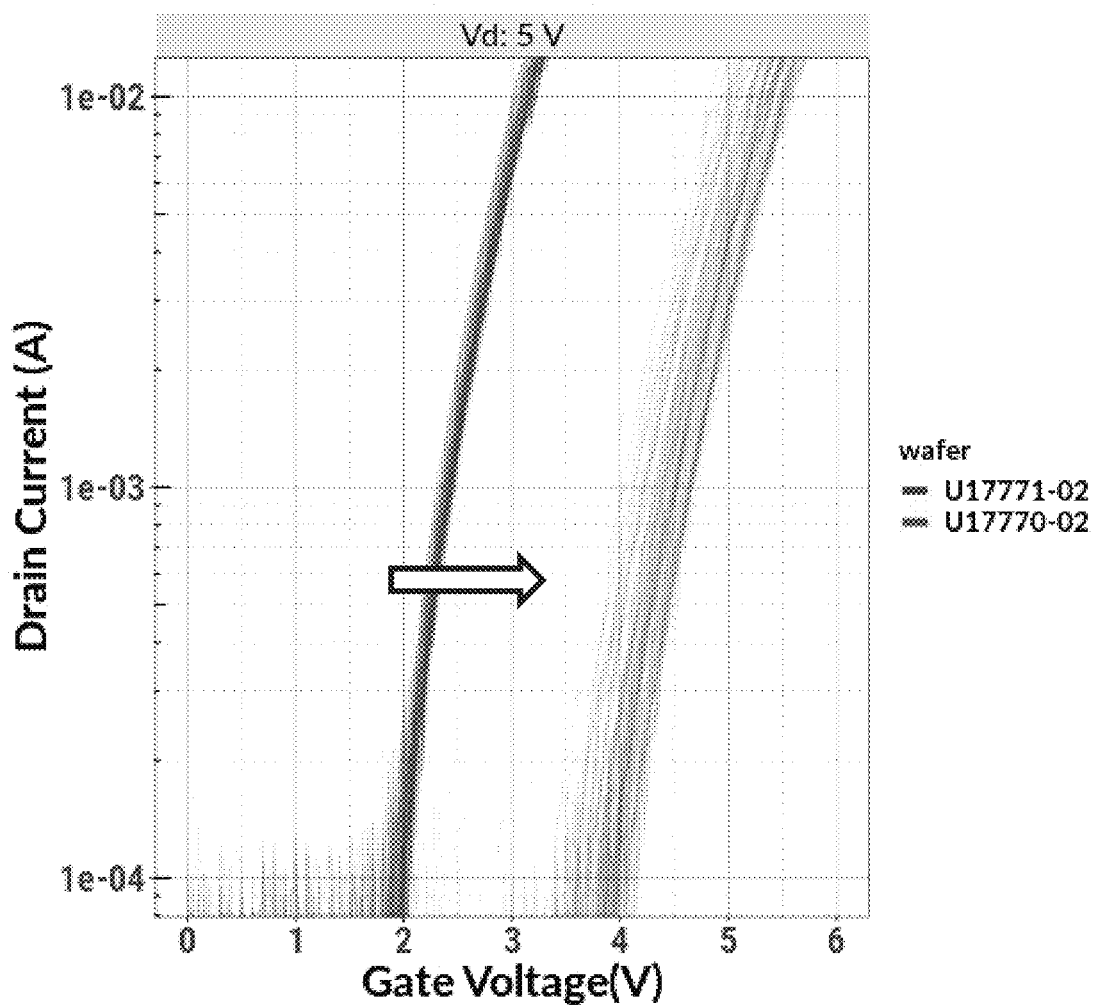
FIG. 4a illustrates a transfer characteristics curve of a device fabricated according to one or more embodiments.

FIG. 4a illustrates a transfer characteristics curve of a device fabricated according to one or more embodiments. A graph shown in FIG. 4a illustrates a plot of a conventional device versus the device fabricated as per the teachings herein. The device, fabricated as per the teachings herein, may be a 6.5 kV SiC MOSFET. The graph is plotted against a gate voltage versus a drain current. FIG. 4a further shows that there is a significant increase in the gate threshold voltage of the device fabricated according to the teachings of the one or more embodiments when compared to the conventional device. The gate threshold voltage of the conventional device is around 3 volts whereas the gate threshold voltage of the device fabricated using this invention is around 5.5 volts.

Figure 4B:
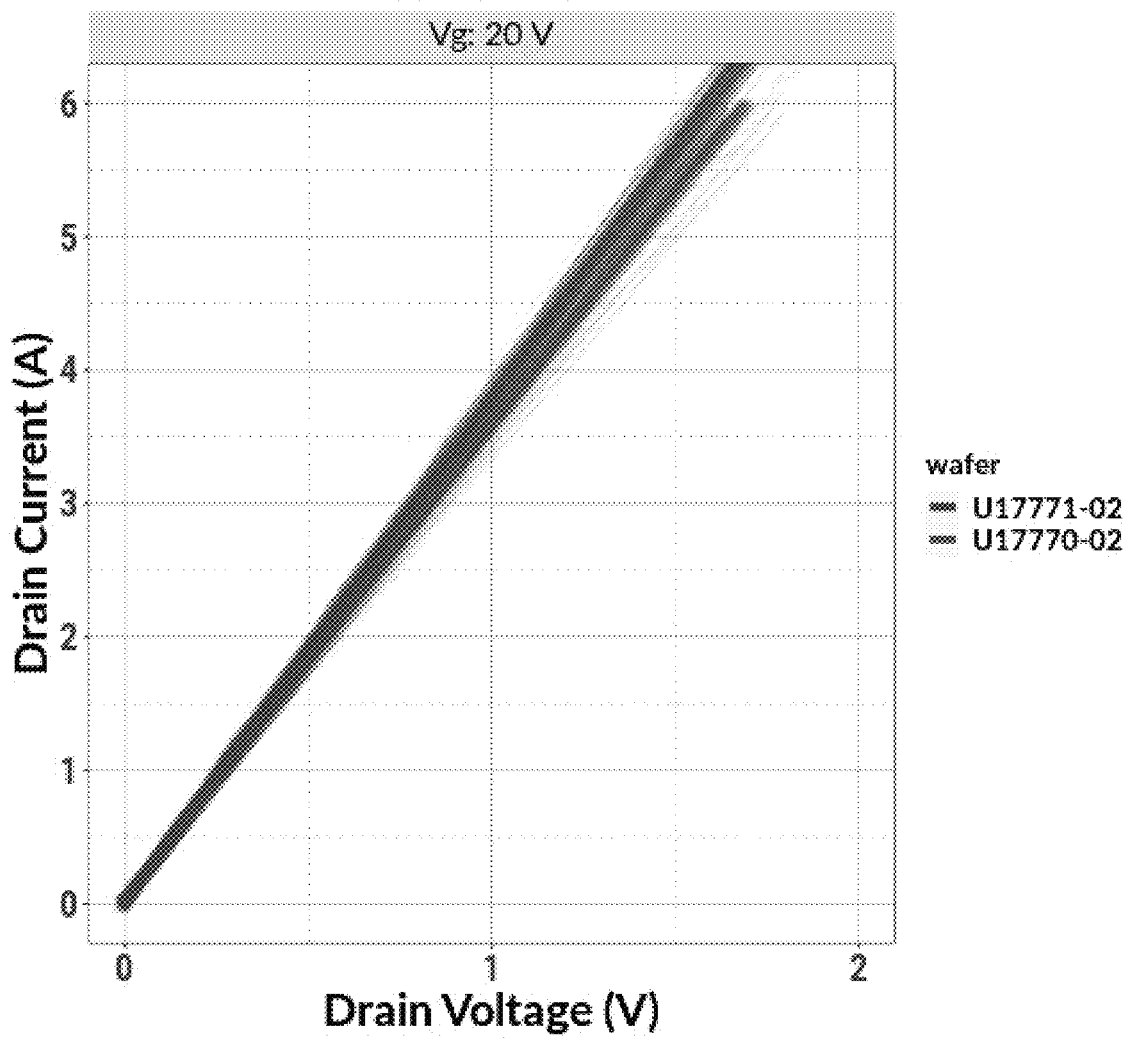
FIG. 4b illustrates an output characteristics curve of a device fabricated according to one or more embodiments.

FIG. 4b illustrates an output characteristics curve of a device fabricated according to one or more embodiments. A graph shown in FIG. 4b illustrates a plot of a conventional device versus the device fabricated as per the teachings herein. The device, fabricated as per the teachings, may be a 6.5 kV rated SiC MOSFET. The graph is plotted against a drain voltage versus a drain current. The graph shows that the drain voltage increases with respect to the drain current. The graph further shows that there is only a slight change in the output characteristics plot of the conventional device (e.g., state of the art device) and the device fabricated according to the teachings of this invention.

Figure 4C:
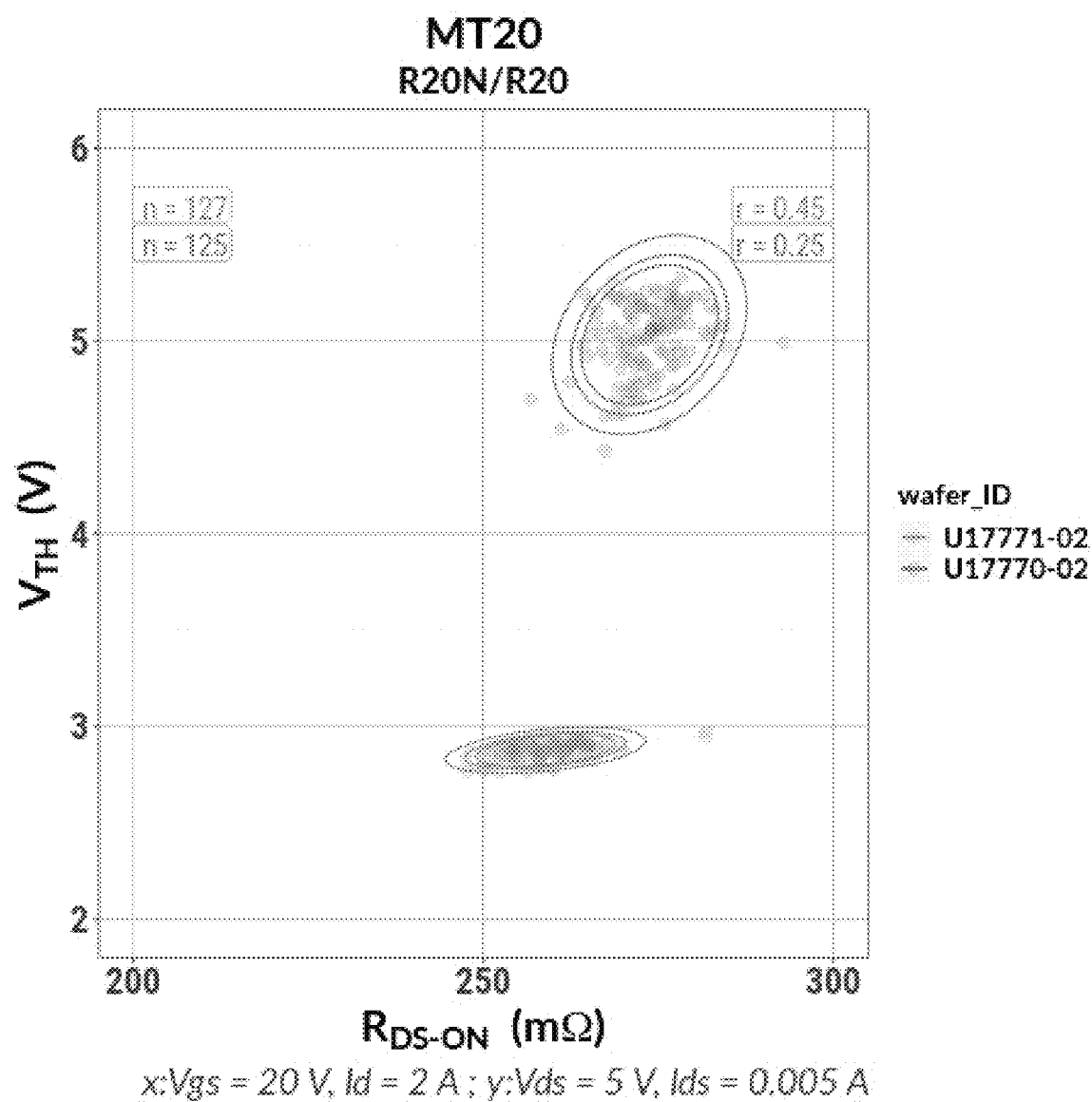
FIG. 4c illustrates a threshold voltage data measure of a 6.5 kV Silicon Carbide (SiC) MOSFET fabricated according to one or more embodiments.

FIG. 4c illustrates a threshold voltage data measured on a 6.5 kV rated Silicon Carbide (SiC) MOSFET fabricated according to one or more embodiments. A graph shown in FIG. 4c illustrates a plot of a conventional device versus the device fabricated as per the teachings herein. The graph is plotted against a threshold voltage ($V_{TH}$) versus a drain to source resistance ($R_{DS\text{-}ON}$). The graph shows that the threshold voltage of the conventional device is about 3 volts, whereas the threshold voltage of the device fabricated is about 5 volts. The increase in the threshold voltage with a minimal increase in $R_{DS\text{-}ON}$ represents a good trade-off, since high $V_{TH}$ is needed in many power conversion applications for safe and reliable operation. The high $V_{TH}$ is used in normally—OFF operation of the MOSFETs. The high $V_{TH}$ also leads to a lower drain saturation current which can result in much higher short-circuit withstand times.

Other embodiments are also within the scope of the following claims.

Although various embodiments incorporate the teachings described in detail herein, those skilled in the art can readily devise many other varied embodiments that still incorporate these teachings. For example, a complementary SiC MOSFET device with a P+ substrate, P− drift layer and P+ source can be created in a N-well region. The embodiments described are all applicable to the complementary MOSFET as well.

In the embodiments and claims herein, the terms "first conductivity type region" and "second conductivity type region" are used to describe n-type and p-type regions respectively for a N type device. For a P type device "first conductivity type region" and "second conductivity type region" are used to describe p-type and n-type regions, respectively.

INCORPORATION BY REFERENCE

All patents, patent application publications, and non-patent literature mentioned in the application are incorporated by reference in their entirety.

U.S. Pat. No. 7,052,963B2 entitled "Method of forming trench transistor with chained implanted body including a plurality of implantation with different energies";
US20190172910A1 entitled "Silicon Carbide Semiconductor Component Comprising Trench Gate Structures and Shielding Regions"
WO2019139610 entitled "Shield structure for a group iii-nitride device and method of fabrication"
U.S. Pat. No. 7,282,412B2 entitled "Trench semiconductor device having gate oxide layer with multiple thicknesses and processes of fabricating the same";
U.S. Pat. No. 7,037,792 entitled "Formation of removable shroud by anisotropic plasma etch";
U.S. Ser. No. 10/217,636 entitled "Method of manufacturing a silicon carbide semiconductor device by removing amorphized portions";
U.S. Pat. No. 7,705,362B2 entitled "Silicon carbide devices with hybrid well regions";
U.S. Pat. No. 8,513,103 entitled "Method for manufacturing vertical transistor having buried junction";
U.S. Pat. No. 6,200,884B1 entitled "Method for shaping photoresist mask to improve high aspect ratio ion implantation";
U.S. Pat. No. 6,215,152 entitled "MOSFET having self-aligned gate and buried shield and method of making same".

What is claimed is:

1. A method comprising:
preparing a unit cell of a silicon carbide (SiC) substrate comprising a first conductivity type substrate and a first conductivity type drift layer;
forming a second conductivity type well region;
forming a first conductivity type source region within the second conductivity type well region; and
forming a second conductivity type shield region surrounding the first conductivity type source region,
wherein the second conductivity type shield region comprises a lateral portion in relation to the first conductivity type source region on a SiC surface;
wherein forming the second conductivity type shield region comprises:
depositing a second mask over a first patterned mask;
etching the second mask with a first etch rate in a vertical direction and a second etch rate in a horizontal direction that is lower than the first etch rate, to form a sidewall spacer over the first patterned mask; and
performing a second ion implantation using second conductivity type ions,
wherein the sidewall spacer comprises a first width at the SiC surface, a second width at a first height that ranges from 20 percent to 70 percent of a first thickness of a first mask, and a third width at a second height that is equal to the first thickness of the first mask.

2. The method of claim 1, wherein forming the second conductivity type well region comprises:
depositing a first mask;
etching the first mask and forming a first patterned mask; and
performing a first ion implantation using second conductivity type ions through the first patterned mask.

3. The method of claim 2, wherein the first mask comprises at least one of:
a silicon oxide layer, a polysilicon layer, and a silicon nitride layer.

4. The method of claim 3, wherein the first mask comprises:
a first thickness ranging from 50 nanometers to 5000 nanometers.

5. The method of claim 2, wherein the first mask comprises:
a top silicon oxide layer, and a bottom silicon oxide layer sandwiching a polysilicon layer or a silicon nitride layer,
wherein a thickness of the first mask is in a range of 1300 nanometers to 1800 nanometers.

6. The method of claim 5, further comprises:
etching the top silicon oxide layer and the polysilicon layer of the first mask;
forming a remnant thin silicon oxide layer; and
performing the first ion implantation using the second conductivity type ions through the remnant thin silicon oxide layer.

7. The method of claim 6, wherein a thickness of the remnant thin silicon oxide layer is in a range of 1 nanometer to 200 nanometers.

8. The method of claim 2, wherein performing the first ion implantation using the second conductivity type ions comprises:
performing one or more ion implantations,
wherein each ion implantation comprises an implantation energy and an ion implantation dose,
wherein the first ion implantation is performed at a temperature in a range of 20 degree Celsius to 1000 degree Celsius,
wherein the second conductivity type ions comprise one of aluminum and boron,
wherein the implantation energy is in a range from 10 kiloelectron volts (keV) to 10 mega electron volts (MeV), and
wherein the ion implantation dose is in a range from $10^{12}$ ions per centimeter squared to $10^{15}$ ions per centimeter squared.

9. The method of claim 1, wherein depositing the second mask comprises a chemical vapor deposition (CVD) of a silicon oxide layer.

10. The method of claim 1, wherein the second mask comprises a second thickness in a range of 200 nanometers to 2500 nanometers.

11. The method of claim 1, wherein the sidewall spacer comprises the first width that is equal to the second width, and wherein the second width is greater than the third width.

12. The method of claim 1, wherein the sidewall spacer comprises the first width that is greater than the second width, and wherein the second width is greater than the third width.

13. The method of claim 1, wherein performing the second ion implantation using the second conductivity type ions comprises:
performing one or more ion implantations,
wherein each ion implantation comprises an implantation energy and an ion implantation dose,
wherein the second conductivity type ions comprise one of Aluminum or Boron, and
wherein the implantation energy is in a range from 50 kiloelectron volts to 5 megaelectron volts.

14. The method of claim 1, wherein forming the second conductivity type shield region further comprises:
forming a first portion of the second conductivity type shield region within the second conductivity type well region,
wherein the first portion of the second conductivity type shield region is not directly underneath a first patterned mask and a second patterned mask.

15. The method of claim 14, wherein forming the second conductivity type shield region further comprises:
forming a second portion of the second conductivity type shield region within the second conductivity type well region,
wherein the second portion of the second conductivity type shield region is directly underneath the second patterned mask, and
wherein the second portion of the second conductivity type shield region connects the first portion of the second conductivity type shield region with the SiC surface.

16. The method of claim 14, wherein the first portion of the second conductivity type shield region is deeper than the second conductivity type well region.

17. The method of claim 15, wherein the second portion of the second conductivity type shield region is closer to an edge of the second conductivity type well region than an edge of the first conductivity type source region.

18. The method of claim 15, wherein the second portion of the second conductivity type shield region is closer to an edge of the first conductivity type source region than an edge of the second conductivity type well region.

* * * * *